United States Patent [19]

Wong

[11] Patent Number: 4,604,144
[45] Date of Patent: Aug. 5, 1986

[54] PROCESS FOR CLEANING A CIRCUIT BOARD

[75] Inventor: Ching-Ping Wong, Lawrence Township, Mercer County, N.J.

[73] Assignee: AT&T Technologies, Inc., Berkeley Heights, N.J.

[21] Appl. No.: 774,674

[22] Filed: Sep. 11, 1985

[51] Int. Cl.$^4$ .......................... C23G 1/02; C23G 1/14
[52] U.S. Cl. .......................................... 134/28; 134/29
[58] Field of Search ................... 134/25.4, 28, 29, 40; 252/142, 548

[56] References Cited

U.S. PATENT DOCUMENTS

| 3,181,984 | 5/1965 | Tillis | 134/28 X |
|---|---|---|---|
| 3,700,591 | 10/1972 | Higley | 210/23 |
| 3,794,523 | 2/1974 | Thompson | 134/3 |
| 3,957,529 | 5/1976 | Alexander et al. | 134/3 |
| 4,014,715 | 3/1977 | Preston | 252/142 X |
| 4,332,624 | 6/1982 | Page et al. | 134/3 |
| 4,397,753 | 8/1983 | Czaja | 252/142 X |
| 4,547,304 | 10/1985 | McEntire et al. | 134/29 X |

FOREIGN PATENT DOCUMENTS 213107  8/1984  German Democratic Rep. ... 134/28

Primary Examiner—Arthur L. Corbin
Attorney, Agent, or Firm—J. F. Spivak

[57] ABSTRACT

In a method of cleaning a circuit board having a silicone encapsulated hybrid integrated circuit thereon, subsequent to aqueous solder flux residue removal with an ionic detergent, the board is cleaned with a low molecular weight organic acid such as formic, acetic or oxalic acid.

10 Claims, 3 Drawing Figures

DURING TESTING SETUP

DURING MEASUREMENT SETUP

PROCESS FOR CLEANING A CIRCUIT BOARD

TECHNICAL FIELD

This invention relates to a method of cleaning hybrid integrated circuits and circuit boards containing such hybrid integrated circuits. More particularly, the invention relates to the removal of contaminants which remain subsequent to the detergent cleaning of flux residues on the circuit boards.

BACKGROUND OF THE INVENTION

Aqueous detergent cleaning is often an integral part of the process of fabricating hybrid integrated circuits which are soldered to printed circuit boards. This is especially true when aqueous type solder fluxes are employed during the soldering operation. It has been found that when using aqueous detergent cleaners to remove solder flux residue, certain contaminants remain which result in an increased leakage current in the hybrid integrated circuit devices. This problem is particularly acute when silicone type encapsulants are employed for encapsulating the integrated circuit devices. Such encapsulants are generally relatively soft and of relatively low density and the contaminants become entrapped within the encapsulant layer. These contaminants may then eventually migrate to the surface of the device itself resulting in as much as an order of magnitude higher leakage current as compared to a control circuit which has not undergone the solder and detergent cleaning procedures. Not only is this higher leakage current undesirable, but the reliability of the devices may be diminished. Consequently, it would be advantageous to employ a cleaning method which removes not only the solder flux contaminants but, also other contaminants which tend to be left on the integrated circuit devices when employing aqueous detergent cleaning.

SUMMARY OF THE INVENTION

The novel method comprises, after aqueous detergent cleaning of a hybrid integrated circuit device on a circuit board, the step of rinsing the board in a low molecular weight mono or dicarboxylic acid such as formic, acetic or oxalic acids followed by a thorough rinsing with deionized water to remove the acid.

DETAILED DESCRIPTION

Figure 1:
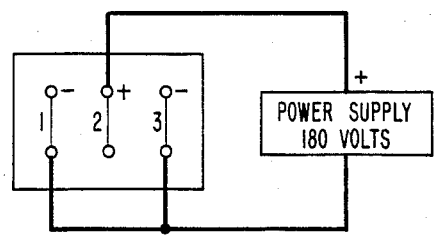
FIGS. 1 and 2 are diagrams depicting the test set up used to evaluate the cleaning procedure.

In order to avoid the use of chlorinated solvents generally employed to remove rosin type flux residues subsequent to soldering of printed circuit boards, it is desirable to employ an aqueous type solder flux which can be washed subsequent to the soldering operation by means of aqueous detergent solutions. However, it has been found, particularly when the printed circuit board incorporates hybrid integrated circuits which have been encapsulated with RTV silicone type resins, that these integrated circuit devices exhibit increased leakage currents and lower insulation resistance by as much as an order of magnitude, subsequent to the aqueous detergent cleaning. I have now discovered that the effect of the aqueous detergent cleaning, i.e., the higher leakage currents, and lower insulation resistance can be significantly reduced by adding the steps of rinsing the aqueous detergent cleaned printed circuit board with a polar organic acid. The preferred acids are the low molecular weight monocarboxylic and dicarboxylic acids such as formic, acetic and oxalic acids. Subsequent to this acid rinse, the circuit board is thoroughly rinsed in deionized water.

It is believed that the cause of the problem which results from aqueous detergent cleaning is the entrapment of components or contaminants in the detergent such as monoethanolamine and ionic surfactants in the RTV silicone polymer matrix of the hybrid integrated circuit encapsulant. It is further believed that the polar acid reacts with the entrapped amines and surfactants to neutralize them without themselves being entrapped within the polymer matrix.

In what should be a preferred embodiment, the polar organic acid aqueous a rinse solution also may contain a certain amount of an alcohol, e.g., methanol etc., or a soluble Freon type fluorocarbon solvent solution so as to cause a certain amount of swelling of the encapsulant which allows the acid to better penetrate the encapsulant for removal of the amine entrapped therein. Alternatively, the encapsulant can first be treated with an alcohol such as methanol, ethanol, propanol or isopropanol or with Freon to cause such swelling prior to rinsing with the acid. Freon is a trademark of E. I. Dupont and refers to various fluorocarbon and fluorochlorocarbon solvents as is well known in the art.

Typical aqueous acid concentrations are from about 2.5 to 10 weight percent of acid dissolved in deionized water, a concentration of about 5% being preferred. In the case of acetic acid, glacial acetic is the base material used to make up the solution. If one employs an acid concentration greater than 10% there is sometimes a tendency of the acid to corrode the hybrid integrated circuit lead wires. If one uses an acid concentration below 2.5%, the effectiveness of the acid to remove the amines and other contaminants is substantially reduced, unless longer times or higher temperatures are employed. Typically, about a 15 minute rinse of the printed circuit board with a 5% aqueous solution of the polar organic acid is sufficient to remove the contaminants left by aqueous detergent cleaner when done at room temperature.

An example of the general procedure for processing a printed circuit board in accordance with this invention is as follows. A clean hybrid integrated circuit (HIC) is encapsulated with an RTV silicone encapsulant. The encapsulated HIC is mounted on a printed circuit board together with other components to be included in the circuit. An aqueous type solder flux is applied to the printed circuit board and the board is soldered by any of the known soldering techniques. Subsequent to soldering, the printed circuit board is treated with an aqueous detergent cleaner to remove flux residues. The circuit board is then thoroughly rinsed in deionized water. Subsequent to this rinse, and in accordance with this invention, the circuit board is then rinsed in an aqueous polar organic acid solution such as a 5% aqueous solution of either formic, acetic or oxalic acid or any mixture thereof. This cleaning may be in the form of a rinse at room temperature for 15 minutes. Subsequent to this rinse, the printed circuit board is thoroughly rinsed for about 15 minutes in deionized water. One may add about 5% to 35% methanol to the aqueous acid solution in order to swell the RTV silicone. Alternatively, as previously indicated, the silicone can be swelled, if desired, prior to the acid cleaning by such swellants as methanol, Freon TA, Freon TMC, Freon TM or Freon TE.

Figure 2:
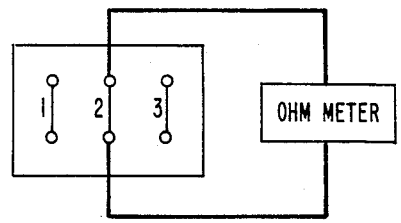
Figure 3:
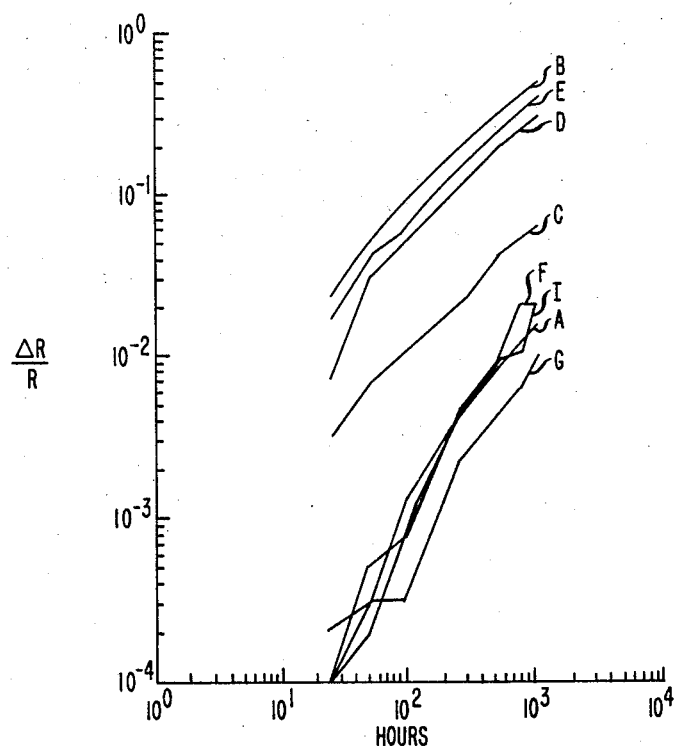
FIG. 3 is a plot showing the average resistance change ($\Delta R/R$) as a function of time of various test circuits cleaned with aqueous detergent cleaning solution and followed by various subsequent rinsing and cleaning steps.

The effectiveness of the novel procedure was determined by electrical tests on a triple track test circuit of the type depicted in FIGS. 1 and 2. This triple track testing circuit comprises fine, closely spaced lines 1, 2 and 3 of tantalum nitride on an alumina substrate. The lines 1, 2 and 3 and spaces therebetween are approximately 3 mils in width. For testing, the test circuits are electrically connected to a power supply and placed in a battery jar within an oven chamber. The circuits which have been coated with the silicone encapsulant employed to encapsulate hybrid integrated circuit devices are then exposed to a high temperature (85° C.), high relative humidity (85%) environment under a positive 180 bias voltage applied to the two outer tracks 1 and 3 while the center track 2 is held at ground potential. After applying this bias for a desired period of time, the bias voltage is removed and the resistance along the tantalum nitride track is measured by means of an ohm meter (FIG. 3). Change of resistance of the tantalum nitride is a measure of the degree of electro-oxidation occurring which in turn is a measure of the leakage current due to impurities in the silicone which cause the resistor to anodize. The change of the resistance with respect to the original resistance is, therefore, a measure of the electro-oxidation process which is caused by migrating ions in the silicone resins. The greater the change of resistance with time due to the oxidation process, the greater the degree of migration or number of contaminant ions present in the silicone resins. Consequently, the less the resistance changes with time, the better the encapsulant material will be. The test conditions represent an accelerated aging test. Comparative tests employing various cleaning procedures were performed.

Referring to FIG. 1, the results of these comparative tests are plotted in terms of the change of resistance divided by the initial resistance as a function of time in the humidity controlled oven. The tests were carried out on test circuits treated in a variety of ways. More particularly, Curve A represents a control wherein an RTV coated test circuit was tested without any cleaning whatsoever, either detergent or polar acid. Curve B represents the results of an RTV coated circuit which was detergent washed with Brulin 815 PCX, a predominately monoethanolamine containing ionic type surfactant marketed by Brulin Co. of Indianapolis, Ind., rinsed with deionized water and dried prior to placing in the oven. As can be seen, the change in resistance with respect to the initial resistance prior to the cleaning procedure or placement in the oven is significantly higher (by several orders of magnitude) as compared with the control sample. Curve C represents a test circuit which was first treated with Brulin 815 PCX, rinsed with deionized water and dried and subsequently had an RTV silicone resin applied thereover. The results of this test indicate that while the detergent leaves a contaminating residue which effects the test circuit, it is more severe when the cleaning procedure is applied over an existing RTV silicone resin as compared with a resin applied after detergent cleaning. This shows that the silicone resin encapsulant tends to trap a substantial amount of the detergent residue. Curve D shows the results of a Brulin detergent cleaned RTV coated circuit which is subsequently cleaned with Freon TA and then deionized water. The Freon TA is a mixture of 89% Freon TF (an E.I. Dupont chlorofluorohydrocarbon) with 11% acetone. Curve E is a test similar to that as depicted in Curve D but using Freon TE-35 rather than Freon TA. Freon TE-35 is 65% Freon TF with 35% ethanol. As can be seen, the Freon treatment without any polar acid treatment does not substantially reduce the amount of contamination which ultimately leads to a current leakage in the test devices. In comparison, Curves F, G and H represent the results found in test circuits having an RTV silicone encapsulant which were treated and washed with a Brulin detergent cleaner and subsequently cleaned with 5% acetic acid (Curve F), 5% oxalic acid (Curve G) and Freon TM-35 (Curve H) respectively, and then rinsed in deionzed water and dried. Freon TM-35 is a mixture of Freon TF and 35% by weight methanol. As can be seen, circuits cleaned in accordance with the cleaning procedures depicted in Curves F, G and H substantially reduce the contamination and hence keep the leakage current at a minimum.

What is claimed is:

1. A method of cleaning a circuit board subsequent to soldering with a water soluble flux which comprises:
    (1) washing the board in an aqueous detergent solution,
    (2) rinsing the board with water,
    (3) washing the board in an aqueous solution of a low molecular weight mono or dicarboxylic acid, and then
    (4) rinsing the board with water.

2. The method recited in claim 1, wherein the detergent solution comprises an ionic type detergent.

3. The method recited in claim 2, wherein the detergent comprises ethanolamine.

4. The method recited in claim 3, wherein the aqueous acid solution comprises at least one acid selected from the group consisting of formic, acetic and oxalic acids.

5. The method recited in claim 1, wherein the aqueous acid solution comprises at least one acid selected from the group consisting of formic, acetic and oxalic acid.

6. The method recited in claim 5, wherein the aqueous acid solution contains from 2.5 to 10 weight percent acid.

7. A method of cleaning a circuit board subsequent to soldering a silicone encapulated hybrid integrated circuit thereon with a water soluble solder flux which comprises:
    (1) treating the board with an aqueous ionic detergent solution;
    (2) rinsing the board with water;
    (3) treating the board with an aqueous solution of a low molecular weight organic acid comprising an acid selected from the group consisting of monocarboxylic acids and dicarboxylic acids; and then
    (4) rinsing the board with water.

8. The method recited in claim 7, wherein the silicone is caused to swell prior to or during treatment with said aqueous acid solution.

9. The method recited in claim 8, wherein the board is caused to swell by means of exposing said board to an aqueous swellant solution comprising a member of the group consisting of alcohol and fluorochlorocarbons.

10. The method recited in claim 9 wherein said alcohol is selected from the group consisting of methanol, ethanol, propanol and isopropanol.

* * * * *